(12) United States Patent
Weiss et al.

(10) Patent No.: US 12,228,625 B2
(45) Date of Patent: Feb. 18, 2025

(54) DETECTION OF UNCONNECTED MR COILS AND LOCALIZATION OF MISPLACED COILS

(71) Applicant: KONINKLIJKE PHILIPS N.V., Eindhoven (NL)

(72) Inventors: Steffen Weiss, Hamburg (DE); Christoph Günther Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 109 days.

(21) Appl. No.: 18/017,881

(22) PCT Filed: Jul. 7, 2021

(86) PCT No.: PCT/EP2021/068789
§ 371 (c)(1),
(2) Date: Jan. 25, 2023

(87) PCT Pub. No.: WO2022/022959
PCT Pub. Date: Feb. 3, 2022

(65) Prior Publication Data
US 2023/0273281 A1    Aug. 31, 2023

(30) Foreign Application Priority Data
Jul. 28, 2020  (EP) .................................... 20188091

(51) Int. Cl.
*G01R 33/36* (2006.01)
*G06T 7/70* (2017.01)

(52) U.S. Cl.
CPC ................ *G01R 33/36* (2013.01); *G06T 7/70* (2017.01); *G06T 2207/20081* (2013.01); *G06T 2210/41* (2013.01)

(58) Field of Classification Search
CPC . G01R 33/36; G06T 7/70; G06T 2207/20081; G06T 2210/41
See application file for complete search history.

(56) References Cited

U.S. PATENT DOCUMENTS 6,492,814 B1   12/2002  Watkins et al.
10,564,245 B2  2/2020   Takagi
(Continued)

FOREIGN PATENT DOCUMENTS

DE   10117249 A1   4/2001
JP   2012055397 A  3/2012
WO   2005017548 A1 2/2005

OTHER PUBLICATIONS

International Search Report and Written Opinion From PCT/EP2021/068789 Mailed Oct. 7, 2021.
(Continued)

*Primary Examiner* — Gregory H Curran

(57) ABSTRACT

A system (SYS) and related method for supporting MR imaging. The system (SYS) comprises a logic (CL) to receive a measurement from RF sensors (SS1-8) arrangeable outside a bore (BR) of an MR imaging apparatus (IA). The logic processes the measurement to establish i) whether there is at least one surface RF coil present that is not electrically coupled to circuitry (SPC) of the MR imaging apparatus (IA) and/or ii) to localize at least one surface RF coil on or at a patient table (PT) of the MR imaging apparatus.

11 Claims, 9 Drawing Sheets

(56) References Cited

U.S. PATENT DOCUMENTS

| | | |
|---|---|---|
| 2005/0253584 A1 | 11/2005 | Campagna |
| 2006/0232275 A1 | 10/2006 | Leussler |
| 2010/0156421 A1 | 6/2010 | Sukkau |
| 2010/0176800 A1 | 7/2010 | Biber et al. |
| 2014/0055148 A1 | 2/2014 | Biber et al. |
| 2015/0253404 A1 | 9/2015 | Tomiha et al. |
| 2017/0038443 A1* | 2/2017 | Ebel ............... G01R 33/36 |
| 2017/0336484 A1* | 11/2017 | Fuderer ........... G01R 33/3692 |
| 2018/0329003 A1 | 11/2018 | Nistler et al. |
| 2019/0008411 A1* | 1/2019 | Faigle .............. A61B 5/06 |

OTHER PUBLICATIONS

T.M. Mitchell "Machine Learning" p. 2, SECTION 1.1, McGraw Hill 1997.

Darl Kuhn Dynamically Updatable Object Recognition System Used in Diagnostic Imaging Systems Ed—ip.com, ip.com Inc., West Henrietta, NY, US, Apr. 4, 2014 (Apr. 4, 2014), XP013162348, ISSN: 1533-0001.

* cited by examiner

DETECTION OF UNCONNECTED MR COILS AND LOCALIZATION OF MISPLACED COILS

CROSS REFERENCE TO RELATED APPLICATIONS

This application is a U.S. national phase application of International Application No. PCT/EP2021/068789 filed on Jul. 7, 2021, which claims the benefit of EP application Serial No. 20188091.1 filed on Jul. 28, 2020 and is incorporated herein by reference.

FIELD OF THE INVENTION

The invention relates to a system for supporting MR imaging, to a patient table for MR imaging, to a method of supporting X-ray imaging, to method of training a machine learning model for use in supporting MR imaging, to a computer program element and to a computer readable medium.

BACKGROUND OF THE INVENTION

Magnetic resonance imaging (MRI) is a celebrated imaging modality as it allows non-invasively obtaining imagery of internal anatomies and/or pathophysiology. MRI uses non-ionizing radiation, as opposed to X-ray imaging modalities.

Same MRI scanners include a cylindrical bore in which the patient is to lie on a patient table during imaging. Space inside the bore is tight. The scanner includes a magnet and coils built around the bore. Both are operated together to acquire data which can be processed into slice imagery to reveal details on internal anatomy, for example for diagnostic purposes.

Some imaging protocols may require using additional mobile coils (also called surface coils) to achieve better image quality at particular region of interest. The one or more surface coils are placed close to the patient at the region of interest. The surface coils include leads with connectors to be electrically connected with the MR scanner system.

It has been observed that sometimes unconnected surface coils may remain inadvertently with a patient on a patient bed. This can degrade image quality, interrupt imaging work flow, may cause damage to the surface coil, or may even injure the patient.

SUMMARY OF THE INVENTION

There may therefore be a need to improve MRI, in particular to make MRI safer.

The object of the present invention is solved by the subject matter of the independent claims where further embodiments are incorporated in the dependent claims. It should be noted that the following described aspect of the invention equally applies to the patient table for MR imaging, to the method of supporting X-ray imaging, to the method of training a machine learning model for use in supporting MR imaging, to the computer program element and to the computer readable medium. According to a first aspect of the invention there is provided a system for supporting MR imaging, comprising:

a logic configured to receive a measurement from one or more RF (radio frequency) sensors arrangeable outside a bore of an MR imaging apparatus, and to process the measurement to establish i) whether there is at least one surface RF coil present that is not electrically coupled to circuitry of the MR imaging apparatus and/or ii) to localize at least one surface RF coil on or at a patient table of the MR imaging apparatus, wherein the measurement is based on a response signal caused by the at least one surface coil. The processing by the logic of the measurement is preferably done whilst the patient and the sensors are outside (or at least partly or wholly outside) the bore. The measurement is preferably a (frequency) spectral measurement.

The electrical coupling of the surface coils may be by connection through leads, cablework etc. The system can detect whether or not the surface coils are so connected.

In embodiments, the logic is based on a pre-trained machine learning ("ML") module. Non-ML embodiments are also envisaged. In such non-ML embodiments, the logic may be configured to fit the measurement to pre-stored reference signals ("signature"). In ML and non-ML embodiments, the measurements may be in time—or frequency domain. The pre-stored reference signals may be that of connected or un-connected surface coils.

In embodiments, the logic is further configured to receive and process imagery acquired by a camera of the patient table.

In embodiments, the system is operable before introduction of patient via the, or a, patient table into the bore of the MRI imaging apparatus, wherein the patient is so introduced only if it established that the at least one (preferably all) surface coil i) is connected and/or ii) is/are localized at a location consistent with an intended image protocol.

In embodiments, the said measurement is an S21 measurement.

In embodiments, the one or more RF sensors are communicatively coupled to the logic in an MRI compliant manner.

In embodiments, the coupling is arranged as an optical link.

In embodiments, the system includes an output port to indicate any one or more of i) that an unconnected surface RF coil is detected, ii) a location of a (connected or unconnected) surface RF coil on or at the patient table, iii) whether or not the location is consistent with an intended imaging protocol.

In another aspect there is provided a patient table for MRI imaging including one or more RF sensors that may be used as in the above mentioned system according to any of the embodiments.

In embodiments, for greater comfort to the patient or to facilitate cleaning of the patient table, the one or more sensors RF are integrated in a surface of the table.

In another aspect there is provided an imaging arrangement including a system as in any of the above mentioned aspects or embodiments, and i) the patient table and/or the MR imaging apparatus.

In another aspect there is provided a method for supporting MR imaging, comprising:

receiving a measurement from one or more RF sensors arrangeable outside a bore of an MR imaging apparatus, and processing the measurement to establish i) whether there is at least one surface RF coil present that is not electrically coupled to circuitry of the MR imaging apparatus and/or ii) to localize at least one surface RF coil on or at a patient table of the MR imaging apparatus, wherein the measurement is based on a response signal caused by the at least one surface coil.

In another aspect there is provided a method of training, based on training data, a machine learning model to obtain the pre-trained machine learning module.

It is proposed herein to perform wireless RF measurements to test whether there are any unconnected coils on the patient table before the patient enters the bore. This is proposed as a stand-alone check or preferably as a redundant check in addition to camera-based assessments. The patient is only allowed to travel into the MRI bore if both checks are negative, i.e. both result in no detection of unconnected coils.

In addition or instead, it is proposed to perform measurements with connected coils that allow to at least coarsely localize the coil on the patient table before the patient enters the bore. Again, this is proposed as a stand-alone check or preferably as a redundant check in addition to camera-based assessments. In case of wrongly placed coils, the patient is asked to reposition the coil, or eventually staff is alerted to help.

The proposed system and methods facilitate interrupted MR work flow, and reduce surface coil damage and injury to patient due to heat build-up in unconnected surface coils. The RF sensors, also referred to herein as "guardian coils" may be based on existing MR coil technology. No additional technology such as RFID or other is required. The proposed system is vendor independent. Existing MR set-up can be retrofitted. Machine learning embodiments allow, after suitable training, robust detection with low error rates, further improving work flow, image throughput and patient safety. The detection of unconnected or misplaced surface coils may also be used with benefit in imaging-therapy systems, to avoid workflow disruptions.

In another aspect there is provided a computer program element, which, when being executed by at least one processing unit, is adapted to cause the processing unit to perform the method as per any one of the above mentioned embodiments.

In another aspect still, there is provided a computer readable medium having stored thereon the program element.

Definitions

"user" relates to a person, such as medical personnel or other, operating the imaging apparatus or overseeing the imaging procedure. In other words, the user is in general not the patient.

The term "patient" will be used herein to indicate the person to be imaged. The use of the term "person" does not exclude animals imaged for veterinary of other purposes. What is more, imaging of inanimate objects such as an item of baggage in security checks or a product in non-destructive testing is not excluded herein.

In general, the "machine learning component" is a computerized arrangement that implements an ML algorithm that is configured to perform a task. In an ML algorithm, task performance improves measurably with training experience. Training experience may include providing the arrangement with more (new and suitably varied) training data. The performance may be measured by objective tests when feeding the system with test data. The performance may be defined in terms of a certain error rate to be achieved for the given test data. See for example, T M Mitchell, "Machine Learning", page 2, section 1.1, McGraw-Hill, 1997.

BRIEF DESCRIPTION OF THE DRAWINGS

Exemplary embodiments of the invention will now be described with reference to the following drawings, which, unless stated otherwise, are not to scale, wherein.

DETAILED DESCRIPTION OF EMBODIMENTS

Figure 1A:
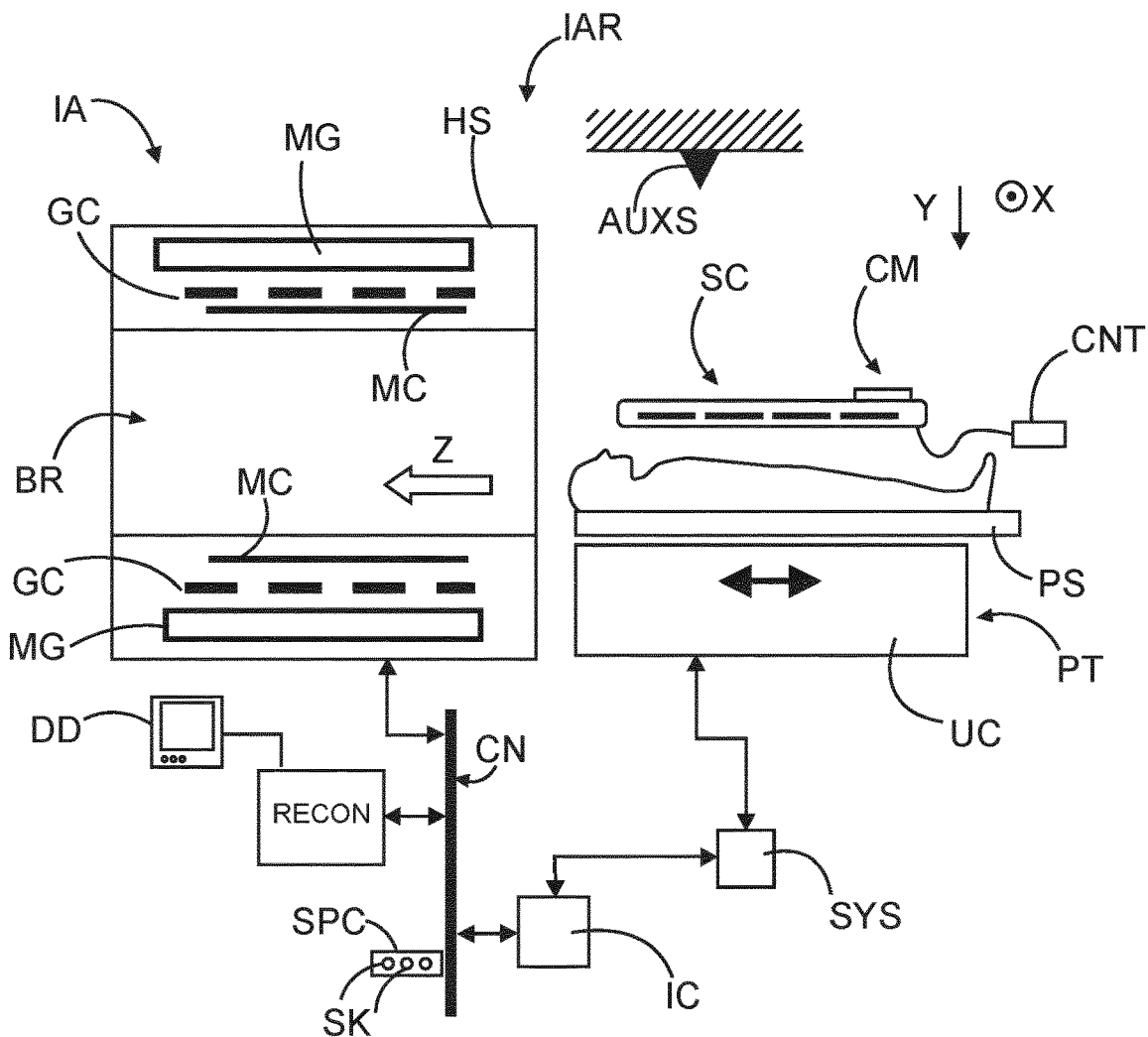
FIGS. 1A, B show an imaging arrangement for magnetic resonance imaging.

Referring first to FIG. 1A, this shows a schematic block diagram of an imaging arrangement AR as envisaged herein in embodiments. The imaging arrangement AR includes an MRI (magnetic resonance imaging) apparatus IA configured to acquire MR medical images of a human or animal patient PAT. The MRI imaging apparatus may be combined into in hybrid imaging or therapy system. Hybrid imaging systems includes MRI-PET(positron emission tomography)/SPECT (single-photon emission computed tomography) systems or CT(computed tomography)-PET/SPECT systems. Hybrid therapy-imaging systems include MRI-LINAC (linear accelerator) or MRI-Hyperthemia systems, or others still.

The magnetic resonance imaging, scanner IA includes a housing HS defining a generally cylindrical scanner bore BR inside of which an associated imaging subject PAT is disposed. Main magnetic field coils MG are disposed inside the housing HS. Main magnetic field coils may be generally of solenoidal configuration to produce a main $B_0$ magnetic field directed along a Z-direction lying parallel to a central axis of the scanner bore BR. The main magnetic field coils are typically superconducting coils disposed inside in cryo-shrouding, although resistive main magnets can also be used. Particularly at higher field strengths and therefore higher frequencies, superconducting magnets are preferred. Whilst FIG. 1A shows a closed cylindrical design, this is not a requirement herein as open design MRI scanners with U-shaped magnets are also envigsed herein, although the principles of what is proposed herein will be of particular benefit to closed design MRI scanners due to their restricted patient space as will become apparent below.

The housing HS may also house or support magnetic field gradient coils GC for selectively producing magnetic field gradients along the Z-direction, along in-plane directions transverse to the Z-direction (such as along Cartesian X- and Y-directions), or along other selected directions.

The housing HS also houses or supports radio frequency head or body coils MC (referred to herein as main coils) for selectively exciting and/or detecting magnetic resonances. Although birdcage coils are common at 128 MHz and below, other coils besides a birdcage coil can be used as a volume transmit coil, such as a transverse electromagnetic (TEM) coil, a phased coil array, or any other type of radio frequency coil. The housing HS typically includes a cosmetic inner liner defining the scanner bore BR.

The MRI arrangement may furthermore include a patient bed or table PT. The patient PAT is expected to lie on the table PT during imaging. The patient PAT is prepared for imaging in a preparatory phase whilst lying on the table PT outside the imager's bore BR. Once preparation has been concluded and imaging is to commence, the patient table PT is operated to introduce the patient PAT into the bore along imaging axis Z, the longitudinal axial direction of the cylindrical bore BR.

More specifically, the table PT includes a payload surface PS to receive the patient. The payload surface is suitably dimensioned and shaped. For example the payload surface PS may be of rectangular shape having suitable dimensions to receive a human patient of average size such as about 2×1 meter, with the long edge along direction Z. The payload surface is usually flat and there may be a mattress component for greater comfort arranged between the patient and the payload surface.

The payload surface with a patient on it is supported from underneath by an under-carriage UC. The under-carriage may include rollers or may be arranged on rails to facilitate moving the bed with the patient on it to and away from the imager AI. The under-carriage UC may house compartments, pockets, shelves etc for staff to place equipment.

A user interface (not shown) integrated in the table may allow operation of the table or the table may be operated remotely from by image controller IC, a computerized arrangement which will be explained in more detail below. The under-carriage UC may also house actuators which allow operation of the table in particular, adjusting the height of the table relative to ground. In addition or instead, actuators may allow advancing the payload surface with the patient on it in a horizontal direction along Z, relative to the under-carriage, so that the patient can be introduced into the bore for the imaging to commence.

Adjustment of the table, in particular advancement of the payload surface, may be affected by manual actuators, such as a set of levers, hand wheels etc. Preferably, however, the arrangement of the table PT is motorized to include suitable electro-mechanical actuators such as stepper motors etc that are controllable by at-bed local user interface, or remotely through the controller IC.

In use, after introduction of the patient PAT into bore BR, the main magnetic field coils MG produce the main magnetic field $B_0$ in a Z-direction which is preferably at least 3.0 T, and more preferably greater than 3.0 T, such as 7.0 T or higher. Lower than 3 T, such as IT or 1.5 T, is also envisaged.

Broadly, operation of MRI comprises an image control stage IC and an image reconstruction stage RECON. Both stages may be administered by suitably configured one or more computing devices. In the control stage, a configured computing device, such as a suitably programmed and interfaced general purpose or dedicated computing device, referred to herein as the image controller, co-ordinates the above described reception and transmission of radio frequency signals through the main coil MC, control of the gradient coil(s) GC, and activation of the magnet MG, or other. The image reconstruction stage is administered by a computing device that runs the above described image reconstruction software or algorithms to process the stored k-space values into MR images in image domain for display, storage or additional processing. The control stage and the reconstruction stage may be integrated into a single computing system or device.

Turning now first to the image controller IC, this includes a magnetic resonance imaging controller to operate magnet controllers to selectively energize the magnetic field gradient coils GC and operates a radio frequency transmitter coupled to one or more of the radio frequency coils MC to selectively energize the main, stationary, radio frequency coil or coils MC arranged inside the bore, to cause a transmit signal to be emitted and to interact with $B_0$ and tissue. By selectively operating the magnetic field gradient coils GC and the one or more radio frequency coils MC, magnetic resonance is generated and spatially encoded in at least a portion of a selected region of interest of the imaging subject PAT. In this manner, an image plane to include at least a part of the ROI may be selected.

The magnetic resonance imaging controller operates a radio frequency receiver coupled to one or more of the radio frequency coils MC to receive image data in form of magnetic resonance k-space data samples that are stored in a k-space memory. The image data may be stored in any suitable format.

The image reconstruction stage RECON may apply a suitable reconstruction algorithm such as a Fourier transform reconstruction algorithm to reconstruct the k-space samples into a reconstructed image including at least a portion of the region of interest of the imaging subject.

The reconstructed image is stored in an image memory, displayed on a user interface of an operator console, stored in non-volatile memory, transmitted over a local intranet or the Internet, or otherwise viewed, stored, manipulated, or so forth. The user interface of the operator console can also enable a radiologist, technician, or other operator of the magnetic resonance imaging scanner IA to communicate with the magnetic resonance imaging controller IC to select, modify, and execute magnetic resonance imaging sequences.

As shown in FIG. 1A, the image reconstructor RECON and the image controller IC are coupled through a suitable communication network CN with the above described hardware and/or software components of the imager IA. The communication network CN, which may be wired or wireless, allows data flow from and to the imager IA. Control signals may be passed from the image controller IC to the imaging apparatus I. Receive signals picked up at main coil MC may be passed through the network CN to the image controller IC and/or into storage in k-space memory and from there onwards to the image reconstructor RECON where they can be processed into imagery. Feeding the data from the coils MC directly to the image reconstructor RECON in a data feed for processing is also envisaged.

Some imaging protocols may require using additional RF coils, sometimes referred to as surface coils SC. There are coil components over and above and separate from the above described main RF coil MC or the gradient coil GC. Whilst the coil work such as the main gradient coil MC or gradient coil GC are stationary components, fixed and installed around the bore BR in the imager IA housing, the surface coils SC are mobile objects removable from or placeable into the bore with the patient PAT. More particularly, the surface coils can be used to provide a smaller more detailed field-of-view-imaging, with improved in-slice spatial resolution, and higher signal-to-noise ratio for a particular region of interest to be imaged. Such regions of interest ("ROI") may include a particular anatomy, such as head, chest, wrist knee, foot etc. When surface coils SC are called for, these may be used alongside and in addition to the main coil MC or instead thereof.

Figure 2:
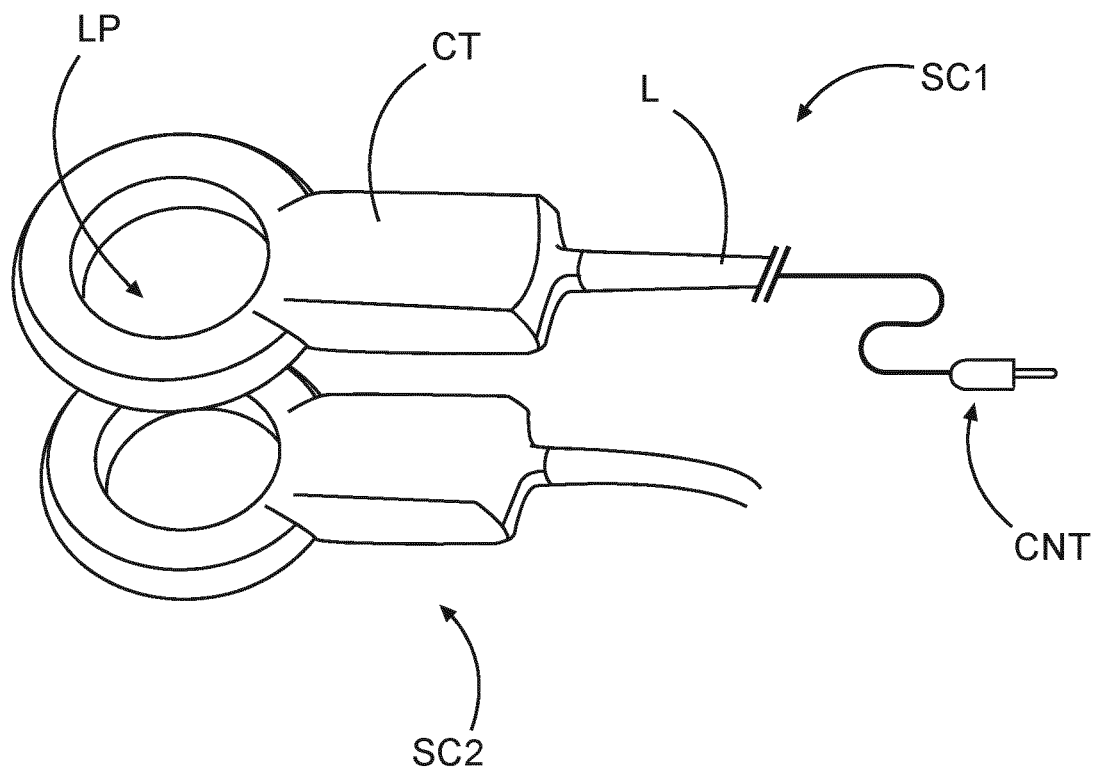
FIG. 2 shows exemplary surface coils as may be used in MRI.

FIG. 2 shows an example of two such surface coils SC1, 2. They are called surface coils SC because they are designed to be worn on the patient's body surface. The surface coils SC have a form a factor that corresponds to the body portion to which they are to be attached to and remain there during imaging. The surface coils so attached via straps or other fastening means are so positioned in proximity to the ROI to be imaged.

Each surface coil SC1,2 may include a RF loop LP of conductive material coupled to circuitry CT in the main body of the surface coil. The RF loop and the circuitry CS are housed in a housing such as a casing of plastic for example. Optionally, the surface coil SC1,2 may include a skin friendly surface lining to make the wearing experience more comfortable for the patient. The surface coils SC1,2 may, for instance, be placed and secured on the patient's abdomen whilst in supine position, or may be placed under the patient in between the payload surface and the patient. Operation of the surface SC is much the same as that of the main coil MC, namely to pick up resonance signals emitted by nuclei in patent tissue. The surface coil SC circuitry CT may be arranged on one or more circuit boards. The surface coil SC circuitry CT may include the (coiled) loop LP with capacitors to adjust tuning. The coil is coupled through an impedance (inductor) and one or more diodes to a pre-amplifier. Active detuning is implemented by the diode in series with the (preferably variable) inductor, which, together with the capacitor, resonatable at the Larmor frequency during use. The circuitry CT may include active and/or passive circuitry components to protect against high current damage. Passive circuitry components may include one or more fuses. The described circuitry structure CT is exemplary, and other circuitry designs are also envisaged. Pre-amplifier provides an output signal that represents the nuclei responses picked up the surface coil SC during use. The pre-amplifier output signal can then be digitized and stored in k-space memory for processing into MR imagery. The circuitry may further include memory component such as an EPROM or other, on which an ID of the coil may be stored for an ID check by the imager IA. The memory component may further store a sanity hardware check routine, a program, to be run upon powering up when connecting the surface coil with the connecting circuitry SPC of the scanner IA.

The surface coil SC1,2 may include, in wired embodiments, a lead L that terminates in a connector CNT, an electrical plug for example. The surface coil connector CNT is couplable into connecting circuitry SPC as shown in FIG. 1A. The connecting circuitry SPC may include a socket SK in which the plug or connector CNT is received to so establish a connection through which electrical signals may pass. The circuitry SPC in communication with lead L and connector CNT allow coupling the surface coil SC loop LP and its internal circuitry CT into the signal chain of the communication network CN. Signals picked up at the surface coil SC during MRI may thus pass from the coil SC to controller IC and or k-space memory or image reconstructor RECON to be processed into MR imagery. The connecting circuitry SPC may be located as the imager's frontend adjacent to the entrance to the bore BR, or may be integrated into the bed PT, in the undercarriage UC or similar, from where the data is forwarded on through cablework or other suitable data connection to couple into the communication network CN.

A surface soil SC coupled in such a wired connection into the said signal chain via the connecting circuitry SPC and lead L/connector CNT arrangement will be referred to herein as "connected". If they are not, this state is referred to herein as "un/- or dis-connected". More than one surface coils SC1,2 may be used together for a given patient PAT during imaging. When connected, the picked up signals can forward into the communication network, and operation power can be supplied to the coil to operate the active circuitry component to protect against current damage.

The surface coil SC1 and SC2 is preferably arranged as a receive-only coil. Depending on the imaging protocol, and the surface coils SC may be used jointly with the main coil. Alternatively, the main coil MC is used without the surface coils SC1, 2, or it is only the one or more surface coils without the main coil MC that is/are used to pick up the nuclei response signal.

Figure 1B:
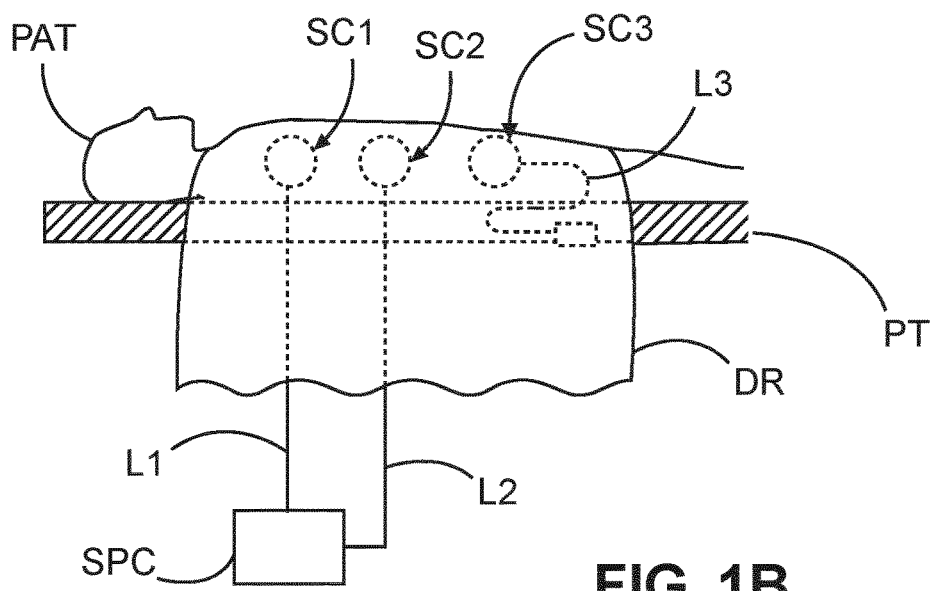

Occasionally it may happen that one or more unconnected surface coil SC3 may be left with the patient PAT on surface PS of table PT. This may lead to an undesirable situation when imaging commences. Such a situation is schematically depicted in side elevation of FIG. 1B where there is a "rogue" surface coil SC3 left unconnected with the patient on the surface PS. The rogue coil SC3 may not be immediately apparent to the patient or staff as it may be occluded from view by drape DR or other covering worn by or covering the patient during the imaging. Some leads L1, L2 of properly connected coils SC1, SC2 may be visible, emerging from under the covering, duping staff into believing that all is in good order according to protocol, whilst a rogue coil may still remain, possibly with its lead LS, tucked away under mattress, pillow or drape or otherwise escaping visual attention. Whilst there are sometimes designated racks, such as the above mentioned compartments/pockets in the bed's PT undercarriage or similar for placing unused surface coils, everyday practice in busy imaging departments does not always allow for such tidiness. Staff on sites with various MRI scanners may sometimes "borrow" surface coils assigned to one scanner and use it at another. Although the intention may have been there, the borrowed coils not always find their way back. A quick visual check on the surface coil rack with all places filled does hence not mean that there is no surface coil left on the bed somewhere.

The situation with rogue coils is undesirable because uncontrolled high currents may be induced in the rogue (surface) coil SC3 during operation of the magnet MG in the imaging procedure. The rogue coil SC3 may heat up, may sustain damage, or may even cause burns to the patient or damage to other equipment in contact with the hot unconnected coil SC3. Unintended, unduly close placement to the main coil MC may cause high currents which in turn leads to the unwanted heat up. Such overheating cannot happen in normal use when the coil SC is connected because it is in particular the active circuitry components that can be operated when connected. The passive component on their own without the active components may not be able to prevent overheating.

In order to prevent unintended rogue surface coils SC to remain with the patient during imaging, a guardian system SYS is envisaged herein that is operable to prevent introduction of the patient into the bore BR, if indeed such a rogue surface coil SC is present. In other words, the proposed guardian system is configured to detect the presence of unconnected one or more surface coils SC3 on the table PT, in proximity to the patient. Advantageously, this allows avoiding imaging aborts. Often, such rogue coils CS3 may eventually be found due to specific signal signatures picked up in the signal chain, but only when the imaging procedure is already underway. Such imaging aborts may be necessary because the bore BR does not leave much room for the patient turn, move, get hold of the rogue surface coil, and pass this on to staff outside the bore for instance. Also, the patient may be sedated or is too inform to be of help. As a consequence, without the guardian system SYS, if such rogue coil SC3 is left behind, the imaging procedure needs to be aborted, and the patient needs to be removed from the bore in order for the rogue coil SC3 to be recovered. It will be appreciated that this can severely impact the work flow and slow down image throughput. Image throughput is a factor to be considered, in particular for busy imaging departments in hospital facilities of large cities, already pressed to the hilt.

In addition or instead of detecting the presence of unconnected rogue coils SC, the guardian system SYS as envisaged herein may be configured to ascertain whether a surface coil, even if connected, is properly spatially placed relative to the patient, in particular the ROI. As mentioned earlier, depending on the imaging protocol to be used, the surface coil needs to be arranged at or around the ROI to be imaged. If this is not the case, image quality may be markedly degraded and a re-take may be required which also slows done imaging throughput. This functionality may be referred to as the location/localization functionality as opposed to the presence detection functionality of rogue coils mentioned above.

Both functionalities, presence detection and localization, can be done jointly as preferred, or one may be done one without the other as required. A user may select which one, or both, of the functionalities are to operate. Each of above described system functionalities may be done on their own as a simple check, or both may be combined into a more elaborate check for localization and rogue coil presence detection.

The guardian system SYS may include one or more auxiliary sensors AUXS, such as an optical camera for instance, arranged in the examination room in front of the imager IA, above the patient bed to image the patient/bed prior to introduction of the patient into the bore. This is shown schematically in FIG. 1A. More than one such cameras may be used, not necessarily positioned for plan view image capture. Some sensors AUXS may be arranged to capture imagery in side view, and/or frontal or rear. Whilst main reference is made herein to optical cameras, this is not a requirement herein. The auxiliary sensor AUXS is not necessarily an optical camera, but may instead be a depth sensing camera, (near)-infrared (IR) camera, etc., or may be any other suitable sensor type such as LIDAR, or others still. More than one sensor type may be used in combination, in particular some or all of the mentioned sensor types.

The localization and/or rogue surface coil presence detection (referred to herein briefly as "presence detection") by the guardian system SYS may be based on the imagery acquired by the sensor AUXS. The imagery represents patient on table PT outside bore.

In another, preferred, embodiment, localization and/or presence detection is achieved by evaluating RF signals received from a set of one, but preferably plural, RF sensors SS. These sensors are similar in construction to the surface coils in that they include RF circuitry coupled to RF coils as described above at FIG. 2. However, as part of the guardian system SYS, these RF sensors SS are not used for medical imaging but used in addition to the one or more surface coils SC (that are used for imaging purposes) and the imager's coil work, the main coil MC and gradient coils GC in the imager housing around the bore BR. The RF sensors SS may be arranged as transceivers, but this is not a necessity as some or all may be receive-only and some others transmit-only. The RF sensors SS may be used in addition to the above mentioned auxiliary sensor AUXS in a two-stage redundancy check setup, or may be used instead of such auxiliary sensor AUXS in a simpler one stage check.

These additional sets of one or more RF coils SS, referred to herein as guardian coils SS, are placed outside the bore BR when used. They are configured to pick up exploratory signals (as will be explained more fully below) that can be processed by the system SYS into a decision as to whether or not the correct localization has been achieved and/or whether or not there are indeed unconnected rogue coils present on the table surface, before the patient is to be moved into the bore BR.

Thus, the presence detection and localization can be based on analyzing optical imagery acquired by the additional camera AUXS and/or on RF exploratory signals as received by the RF sensors SS. In a redundancy check, only if both analyses reveal that there is correct placement and/or there is no unconnected coil present, is the patient allowed to be introduced into the bore. The guardian system SYS may intercept and block a request, for example remotely issued by the image controller, to introduce the patient into the bore if at least one of the above mentioned analyses fails. Thus, a redundancy check system has been established by the system to ensure proper localization and/or absence of rogue coils with low error rate. In particular, false negatives or falls positives can be avoided. The two functionalities of localization and rogue coil detection will be explained more fully below at FIG. 4. The guardian system SYS may not necessarily actively intervene in the control signal chain, but may instead simply issue an all-clear or alert signal.

Figure 3:
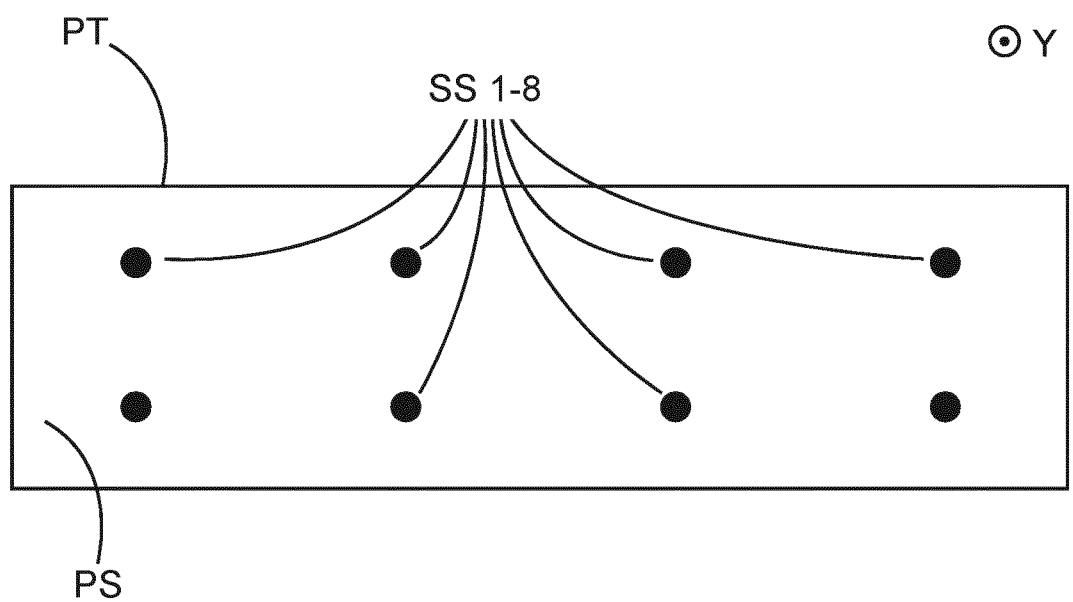
FIG. 3 shows a patient table top including radio frequency sensors.

Turning now first to FIG. 3, this shows one embodiment of how the additional guardian coils SS, SS1-8 may be arranged in proximity of the patient. In one embodiment, the guardian coils SS are placed on the surface PS of the table. The coils may be arranged in regular layout as shown in plan view, along direction Y in FIG. 4. In one embodiment, a 2-by-4 layout of 8 such guardian sensors SS1-8 is used but any other layout, regular or irregular, in any number of such coils are also envisaged herein.

It will be appreciated that the more additional sensors SS1-8 are placed, suitably tightly packed per unit area of the surface PS, the more accurate the location detection can operate. The guardian SS coils may be arranged on the bare payload surface, fixed by gluing, or other. The mattress may be placed on top in one example, so as to sandwich the coils SS between surface PS and optional mattress. For greater comfort still, the payload surface PF may include suitable depressions into which the surface coils are integrated so as to be essentially flush with the upper surface of the payload surface PS. The guardian coils SS1-8 are partly or fully integrated into the payload surface PS. Because typically fully RF radiation transparent materials are used for the payload surface PS, the guardian coils SS1-8 may be completely embedded and sunk at a depth into the surface so that their presence cannot be revealed by visual inspection. Alternatively to placement in or on surface PS, the guardian coils SS1-8 may be integrated into the under-carriage UC, so long as sufficient proximity to the patient is guaranteed. A sufficient proximity for the frequency of the signals to be envisaged herein is a range of up to 10 cm for example. A placement of the guardian coils SS raised above the surface, either mounted on a framework around the table or in a raised edge or similar may also be possible.

In examples, the guardian coils SS are circular, about 2 cm in diameter. They are preferably arranged as transceivers, couplable into the communication network CN, and hence into the transmit-and-receive-signal-chain of the MR scanner IA. Some or each guardian coil may have its own transmit/receive channel. Alternatively, fewer such channels, (such as single channel) may be used, that is/are switched by a multiplexer to connect each one of the transmit coils in turns, while the other ones are switched into receive mode. In transmit mode, above mentioned RF exploratory signals are transmitted. The RF exploratory signals interact with the one or more surface coils, including the rogue coil, to produce response signals, which are then detected in receive mode by the one or more guardian coils. The response RF signals may be processed as will be explained in FIG. 4 below to establish presence of rogue coils and/or correct placement of coils (connected or not). Preferably, rogue coil detection is done first. Once rogue coil has been removed, correct placement of remaining (connected coils) is queried. Alternatively, both, presence detection and placement check, are done at once.

In order to avoid disturbing MR signal reception at the surface coils SC for MR imaging, also a local battery-powered, electrically isolated, but still wirelessly linked and software-controlled, guardian coil SS may be used. This is because the RF signal transmitted or received by the guardian coils SS for rogue surface coil SC3 detection does not need to be phase-locked to the MR receive chain, as it is required for RF transmission for the purpose of MR imaging. Optical links or wire-less links operated at much higher frequencies than the RF for imaging may be used to provide full B1 transparency for the patient table PT.

Figure 4:
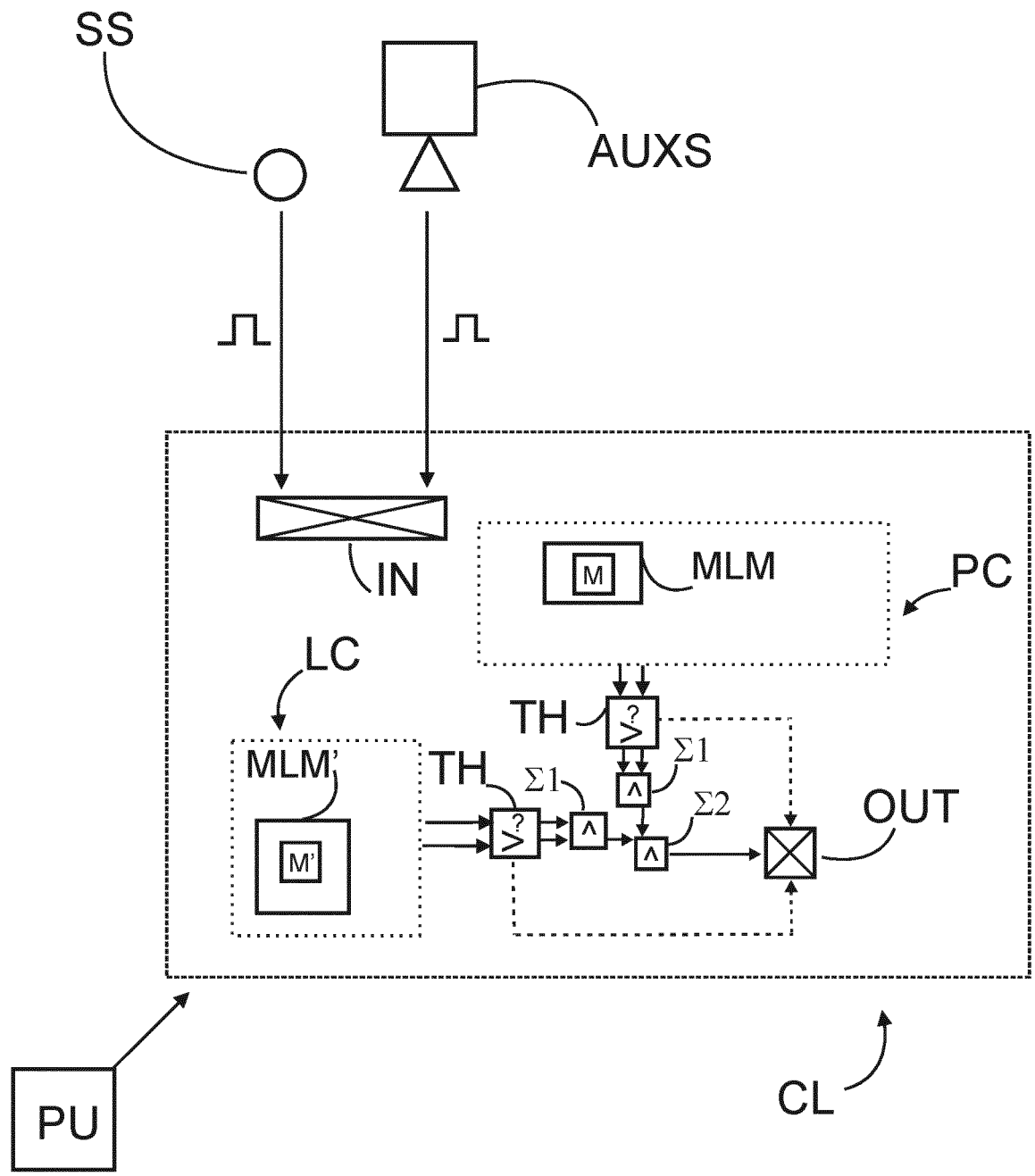
FIG. 4 shows a block diagram of a guardian system SYS as envisaged herein according to one embodiment.

With reference to the block diagram of FIG. 4 operation of the guardian system SYS is explained in more detail.

Input signals are received at an input port IN. The input signals are either the RF signals provided by the guardian sensors arranged on the patient's table as described above in FIG. 3 and/or optical or other imagery acquired by the camera system AUXS of the patient on the table PT in front of the bore.

In correspondence to the above described two functionalities, the system may include a location component LC and/or a presence detection component PC.

The location component LC processes the signals received from the guardian sensors and/or the imagery received from the camera AUXS into a probability for a correct location of a coil, connected or unconnected. The correct location is the one prescribed by the imaging protocol to be used. For example, in wrist imaging the ROI is patent's wrist and this is where at least one surface coil SC should be located.

In embodiments, the optical imagery acquired by auxiliary camera system AUXS is image-processed by the location component LC to determine whether or not surface coil CS location is correct according to imaging protocol. Alternatively or in addition, the RF signals received by the guardian coils are processed by location component LC to detect typical signal fingerprints of the surface coils SC. Alternatively, a machine learning module MLM' may be used. These embodiments will be described more fully below.

The location component LC in the redundancy check embodiment processes separately and by different techniques the two input data types, the optical imagery and the radio frequency signals from the guardian sensor, to arrive at respective probabilities p1, p2. The probabilities each represent the likelihood for correct location of surface coils based on processing the respective data type. Both probabilities may be thresholded by thresholder TH against a respective minimum error probability threshold. A logical "AND" combiner checks whether both conditions as per the two thresholds are met, and only if they are, a confirmatory output signal is produced at output port OUT. Otherwise, an alert signal is issued, as described in more detail below.

The presence detection component PC to establish presence of forgotten rogue surface coils SC3 can likewise act on the two data types, or only on one of them. The presence detection component of the logic CL processes either optical imagery of the patient on the table outside bore or RF signals received by the guardian coils SS, or on both data types in a redundancy check setup as described above for the location component LC.

Again, and preferably, a redundancy check is performed where each data type is processed separately by different techniques to reveal two respective probabilities p1, p2 for rogue coil presence. Both probabilities are thresholded by respective thresholder TH against a respective error probability threshold. As for the location component LC, the error probability thresholds may or may not differ. The results of the thresholdings by thresholder TH are combined as before by a logical "AND"-operator into an output signal that indicates, whether or not patient PAT can be introduced via bed PT into bore BR for imaging going forward. In addition or instead, the output signal may be used to actively control the imaging procedure in cooperation with the image controller such as in an autonomous imaging setup.

For either one of presence component PC or location component LC, if only a simple, non-redundancy check is required, based on only one of the two data types, only one thresholder TH is user, and no logical AND-combiner is required. The output signal as provided at output OUT is then based on this single thresholding as shown in FIG. 4 by dashed lines.

The location check and presence check may also be used as standalone components, one without the other. Furthermore, whilst the redundancy check by each component LC, PC may be useful, this is not required in all embodiment, and each component may act only on one of the data types—the RF signals received by the guardian coils or the imagery acquired by the camera AUXS— as a simple checker rather than as a redundancy checker.

However, a redundancy check based on both data types is advantageous as sole reliance on optical imagery provided by sensor AUXS is error prone. There may not always be a direct line of sight to reveal the rogue coil SC3. As described above in FIG. 1B, the rogue coil SC3 may be occluded by straps, coverings, the patent herself, etc. The additional redundancy channel provided by the response RF signal received by the guardian coils SS complements the optical imagery based processing as no line of sight is required. In addition, relying on RF signal processing only may at time yield borderline predictions and in this case the additional check provided by the camera's AUXS imagery may be helpful to reach a final decision. In redundancy checks, first and second order error rates (false positive or negatives) can be reduced as compared to single channel checks.

In either one of the above embodiments, whether location check LC and presence check C are both done, or only one of the two without the other, a control signal may be directly issued through output port OUT to the electro-magnetic actuator(s) in the patient table TB to automatically effect introduction of the patient into the bore once the check is passed. Such direct automatic control is useful in autonomous imaging setups. In autonomous setup it is the imaging system and/or the patient herself that or who perform supporting tasks, and not staff. Such tasks may include preparing the patient and the surface coils SC for imaging, or introduction/removal of patient into or from bore, and placement/removal of coils SC from the system IA/bed PT. Alternatively, in some non-autonomous settings, there is no such automatic introduction, and instead an all-clear-signal is issued through output interface OU. The all-clear-signal my drive a transducer such as a loud speaker to sound at a corresponding sound signal, a lamp to issue a light signal, or a display controller to control the display device DD in the control room to inform the user. It is then the user who initiates the patient's introduction into the bore. If the check(s) are not passed, an alert signal issued. A request for introduction of the patient into the bore may be blocked. Such an all-clear signal to provide auditory, visual or haptic confirmation/alerts may also be used in autonomous settings to inform the patient.

In embodiments where both location check LC and presence check PC are conducted, these may be further combined by a second stage logical "AND"-operation $(\wedge)\Sigma^2$, and the patient is allowed to be introduced into the bore only if there is no presence of unconnected surface coils and there is a correct placement as per the location check. Otherwise, an alert signal is issued and/or, in an automated setup, introduction is halted/barred or allowed to proceed.

The control logic CL may be implemented by a processing unit PU. The processing unit may be integrated into computing systems of the imaging control IC stage.

Turning now to operation of the presence detection component PC based on RF signals as received by the guardian coils SS in more detail, this is preferably (but not necessarily) implemented by a machine learning module MLM. The machine learning module includes a pre-trained learning model M. The machine learning model has been trained previously on training data as will be explained in more detail below.

Figure 5A:
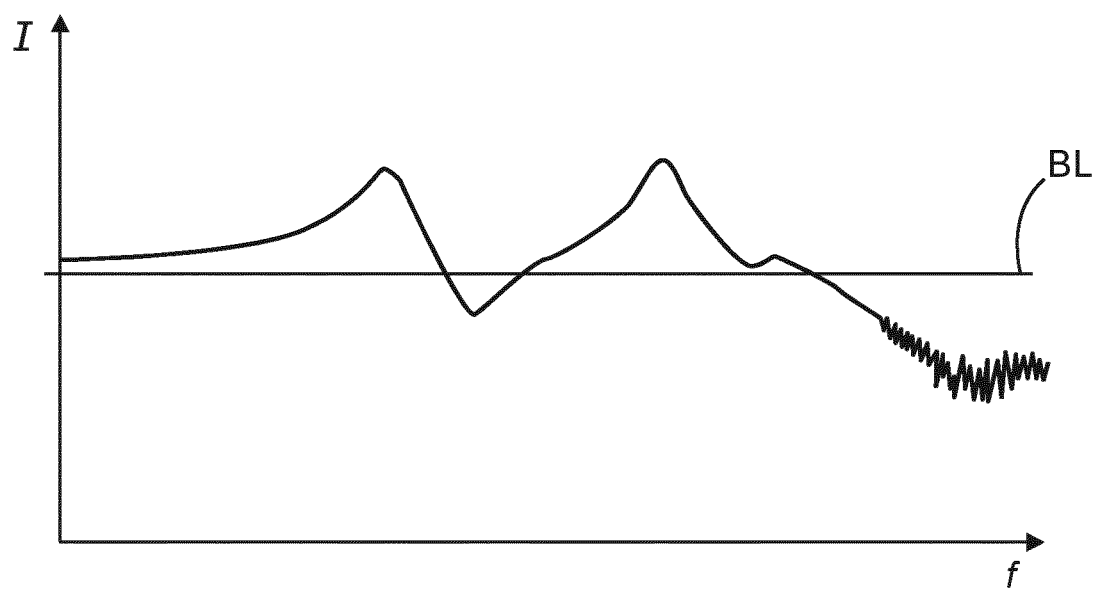
FIGS. 5A, B show spectrograms that may serve as an input for the guardian system.

FIG. 5A, B illustrate examples of such RF input signals in form of spectrograms that may be obtained by Fourier analysis of the RF signals received and sampled at the guardian coils SS in time domain. Specifically, the data in $f$-domain shows frequency along the horizontal axis versus intensity along the vertical axis. The spectrograms are shown against a base line BL with spikes caused by resonance responses of unconnected coil(s) SC3.

Figure 5B:
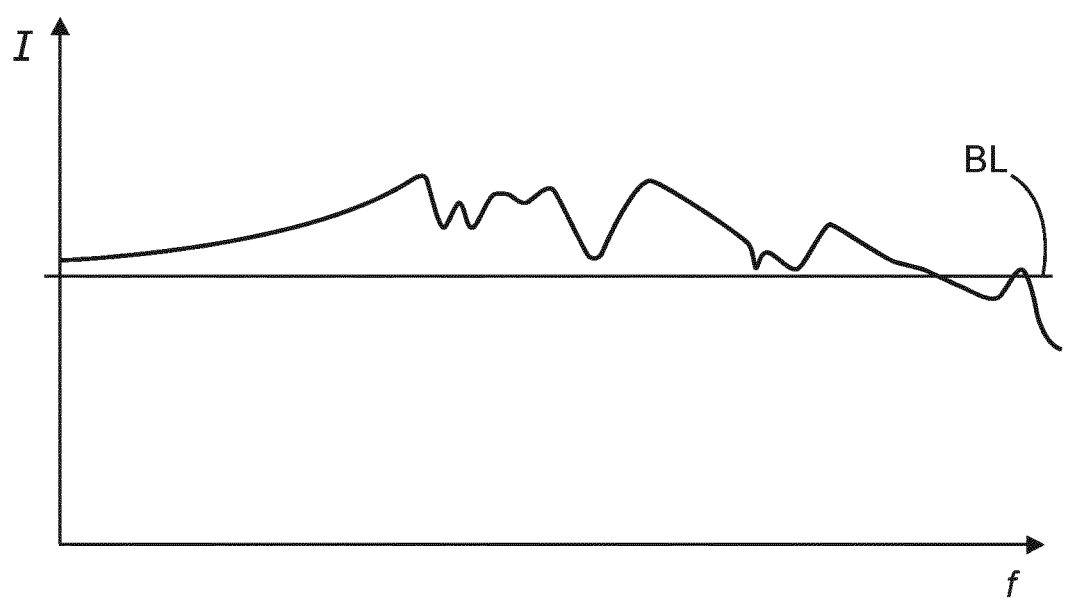

For detection of the unconnected coils, the guardian coils may be operated as follows. Each or some of the guardian coil SS is switched in turn to transmit with a sweep over a frequency range in which resonances of unconnected MR RF receive coils are expected. This range is typically the Larmor frequency+/−10 MHz. S21 measurements are then performed. Specifically, whilst one of the guardian coils SS transmits (is in transmit mode), at least one, or preferably all other guardian coils SS, are kept in receive mode to acquire the spectra, at least some of which will show resonances if any unconnected coils are present as illustrated in FIGS. A, B. Additional such spectral measurements may be obtained, wherein, one-by-one, some or all guardians are switched into transmitters, with earlier transmitting coils SS switched back to receiving mode, and so on. FIGS. 5A, B illustrate such S21 measurements, using two transceivers, one in transmit and one in receive mode. Typical resonance spikes indicate the presence of unconnected MR coils. FIG. 5A is the spectrum of a FlexM coil, whilst FIG. 5B is the spectral response of an Anterior coil. Such spectra are typical for MR coils, so that the presence of a rogue coil can be detected by software based processing as is proposed herein. The spectral signatures have been found to vary in a characteristic manner with coil type, so coil type may optionally also be established herein. For comparison, the flat baseline traces BL in FIGS. 5A, B were acquired without any (unconnected) coils present.

Some or all of the spectra measured in the S21 procedure may be processed by the machine learning module MLM previously trained on labeled data. The training data may be gathered in trainings session, with one or more of different such unconnected surface test coils being placed in different positions on the patient table and spectrograms are recorded by operating the guardian coils, switching between transmit and received mode to pick up elicited responses from unconnected test coil on the table. Similar spectrogram may be recorded with the test surface coils connected. A human expert can easily tell from the experimental setup, or even from the spectrogram itself, whether or not a surface coil was present. In this way the training data may be labeled and then provided as training input to the machine learning module. Parameters of the machine learning model are then adapted in an optimization procedure as will be described in more detail below.

A classification task of the spectrograms of coil responses such as recorded in one or more multiple S21 measurements as illustrated in FIG. 5 lends itself for machine learning based processing as it would appear difficult to predict the rogue coil presence based on simple thresholding. Although not excluded herein in non-ML embodiments, "classical", analytic signal processing methods tend to be more error prone due to noise etc. Unlike analytic processing, machine learning approaches do not require specific assumptions on dependency and so can be more robustly trained on previously acquired training data. In the ML-optimization procedure, an initial set of parameters of the ML-model are adapted in light of the training data. The so adapted parameters may be thought of to "encode" the relationship between spectrograms on the one hand and presence of rogue coils on the other.

An architecture of the ML model M may be chosen as an artificial neural network with one or more fully connected hidden layers, with a combination layer (such as a softmax layer) as output layer. The output layer combines feature maps from the previous layer into a probability distribution for the rogue coil presence. When processing spectrograms, such as the like of FIG. 5, a hybrid architecture may be used, comprising both, convolutional and fully convolutional layers. Alternatively, a purely fully connected neural-network is used as these types of NN have been found to be better at processing non-image data such as the spectrograms in FIG. 5. Again, a combination layer at the terminal output layer combines the previous feature maps into the desired probability distribution over the two labels lb1,lb2 (lb1="rogue coil present", lb2="rogue coil not present"). Turning now to processing the optical imagery, here too a machine learning module, based on a neural-network for instance, may be used. The machine learning module may process the optical imagery received from the camera to decide whether or not there is a presence of unconnected coils SC3. To facilitate this classification task, the surface coil may be equipped with distinctive marker CM that allows more easily identification of the presence of unconnected coils. The coils of the lead cable may be taken into account for recognition of the coil. Whilst operation of presence detection based on optical imagery taken from above the table PT as shown in FIG. 1A is preferred, one or more further cameras arranged at the side, around the table, may be used to acquire further imagery of the patient on the table. If optical image data is processed by machine learning, preferably a neural-network architecture with convolutional layers is used as this type of NN models have been found to yield good results on processing image type data for the task of recognizing whether an object is present in the image.

Instead of using ML approaches, the presence component PC may process imagery by classical image processing such as segmentation, shape detection and intensity value thresholding etc. For example, segmentation based image processing may be used to detect rogue coils SC3 as characteristic "tadpole"-shapes, formed by main body and the appended lead. The lead terminates in the connector CNT. Thus, if unconnected, this state may be found by segmentation for "tadpole" structures. If the tail (the lead) terminates into a broadened structure, the connector is visible, the surface coil thus unconnected. Model based segmentation (MBS) can be used, using the tadpole-like plan view image footprints as shape priors for example.

In the image-based embodiments of the localization component LC, using the optical imagery by camera AUXS may allow deriving the location of the patient on the table, and to check whether the surface coil SC is roughly placed on the correct location on the patient for the planned scan.

The processing by the presence detection component PC of the radio frequency signals and/or the optical imagery may be done by separate machine learning components MLM, or may be done unitarily by a single machine learning module.

Turning now to implementation of the localization component LC, this can be done with or without machine learning. For ML embodiments, similar architectures as described above for the presence component PC may be used. The ML embodiments will be described in more details below at FIGS. 7-9.

As described above in the S21 measurement protocol for the presence component PC, response spectral readings from the distributed guardian sensors SS on the table are obtained by switching the guardian coils SS in turn between transmit and receive.

In a non-ML based embodiment, intensities of the spectral readings from some or each of the sensors SS can be compared. Sensors SS that are in closer proximity to a surface coil SC may respond with high intensity readings. The readings collected from some or all SS coils can be compared. Guardian coils with the highest intensity reading are then taken to be closest to the location of the surface coil. As the location of the sensors SS are known, so is then the location of the surface coil, within an error margin that corresponds to the distances of the guardian coils in the respective layout. Because the imaging protocol is known, and hence so is the ROI, the correct position for the coil can be correlated with the guardian sensor layout. Correct surface coil SC placement can be established based on this correlation. One may use the signal strength or intensity at a given target frequency, such as the Larmor frequency, but any other frequency in the spectrum may be used as well.

Optionally, Instead of or in addition to using the guardian coil spectral response, the spectral response of the connected one or more surface coil is analyzed for signal strength. There are typically (but not necessarily) a plurality of receive coil elements i in a surface MR coil SC, such as up to 30, eg 32, or more or less. Each coil element produces a receive signal with some strength $s_i$. Elements which are nearest to the currently transmitting guardian coil SS will provide the strongest signal. Considering signal intensities at the target frequency as received by some or all the guardian coils, allows at least a coarse localization of the surface MR coil as known in the art.

Optionally, as an additional check, one measures the coil load for some or all connected surface coils as known in the art. Coils which are sufficiently close to the patient will experience a higher load, i.e. a wider resonance width, whilst coils that are lying further away from the patient experience a lower load or no load at all and therefore very small resonance width. The resonance width is determined via an S11 measurement using the coil connection. This information allows a further check whether surface coil required for a particular scan is actually placed on the patient.

Non-ML embodiments of presence detection component PC based on RF measurements will now be described in more detail. It has been found that the guardian coils SS may record clear and distinguished signal signatures of connected surface coils SC. The individual RF function F1-N of some or each surface coils SC may be stored in a database MEM in a preparatory phase. However, unconnected surface coils SC3 couple with coils present in the system, or cause a signal function to be measured different from baseline readings when no such surface coils are present.

In one embodiments, unconnected rogue coils SC3 may be detected using the guardian coils. The system starts to sequentially switch on/off all some or all connected coils SC and the guardian coils measure the individual signal function F, for example in time domain.

The measured function registered at guardian coils is compared with the signal function signatures stored in the database MEM. An amplitude-parameter (magnitude) A may be tuned to as to fit the measured function F to some or each of the stored functions, F=A1*F1. If a result of the fit is within an error margin (for example<10%) then the logic CL concludes that there is no unconnected coil present in the system. Otherwise, if no fit can be so achieved, there is a probability that an unconnected rogue coil SC3 is present in the system. The user or the autonomous system may be informed to stop the workflow and removal of the not needed coil or its connection with interface SPC is advised.

Another tell-tale sign of unconnected coils SC3 are their typical frequency response spectrum P. In another embodiment, it is these spectrums that are stored in database MEM. The guardian coils SS are used to measure the frequency response $\tilde{F}$ to detect an unconnected coils SC3. The measured frequency response $\widetilde{F1}$ is fitted to the pre-stored reference spectra by adjusting an intensity parameter A, such as $\tilde{F}=\widetilde{A1}*\widetilde{F1}$. If more than one unconnected coil is present on the patient table, a curve fit is performed adapting the individual coil parameters $\widetilde{A1}$-$\widetilde{A5}$, $\tilde{F}=\widetilde{A1}*\widetilde{F1}+\widetilde{A2}*\widetilde{F2}+\widetilde{A3}*\widetilde{F3}+\widetilde{A4}*\widetilde{F4}+\widetilde{A5}*\widetilde{F5}$. Additionally, combinations of spectra of unconnected coils can directly be stored in database.

Figure 6:
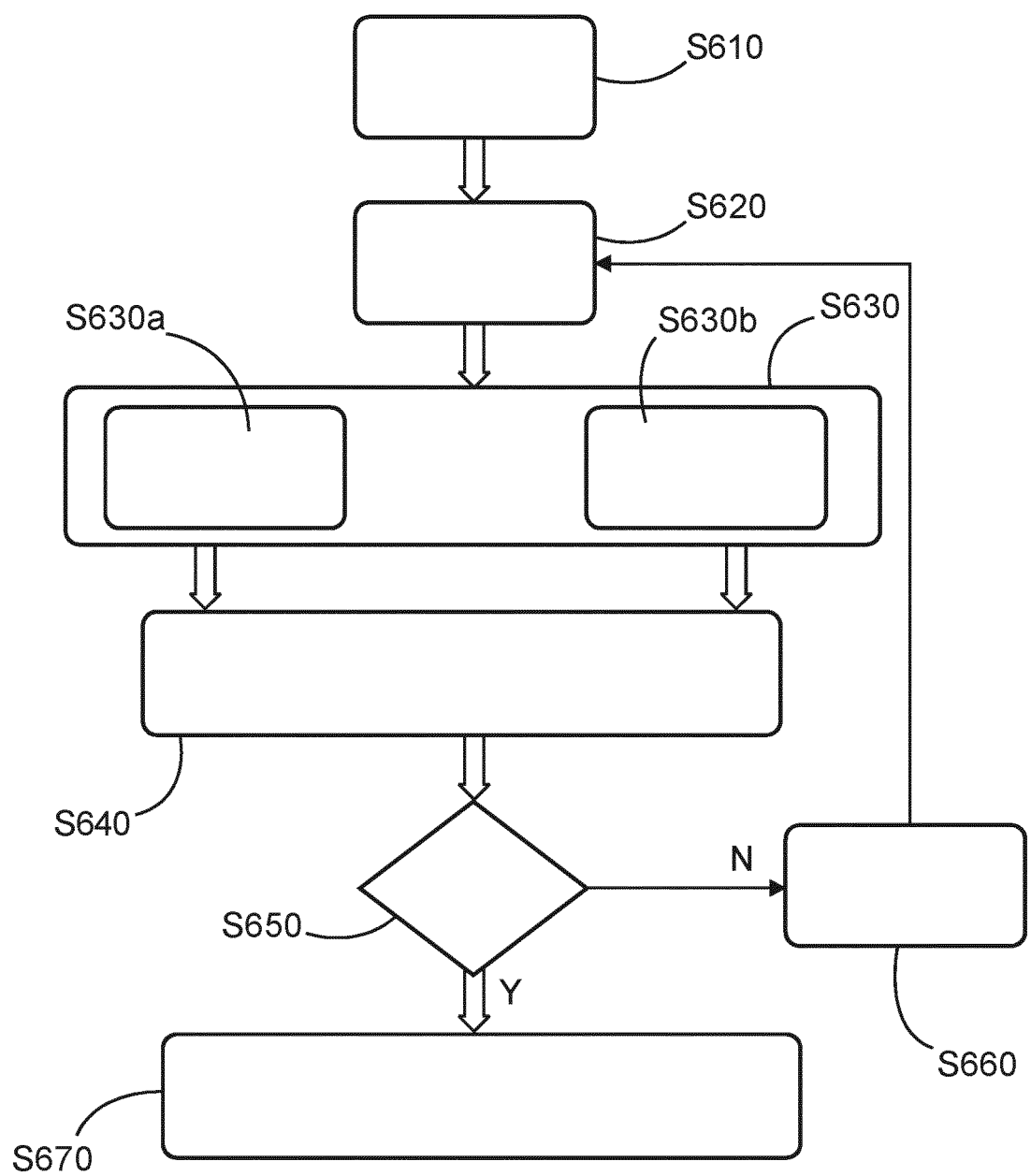
FIG. 6 shows a flow chart of a method of supporting MR imaging.

Reference is now made to FIG. 6 which shows a flow chart of supporting MR imaging. It will be understood that the described method and its steps may be used to implement the above described guardian system SYS. However, the method described herein is not necessarily tied to the system architectures disclosed above and may also be understood as a teaching in its own right.

At step S610 a preferably double redundancy check for location and/or placement of unconnected surface coils in an MR set-up is initiated.

At step S620 an optional check is performed at the connecting circuitry SPC whether or not surface coils are connected to the system.

At step S630 input data is collected.

Specifically, at step S630*a* an optical image is acquired by a camera of the table with the patient on it outside the bore. The image is preferably in plan view from above the table.

In addition or instead of step S630*a*, at step S630*b*, guardian sensors in the form of radio frequency coils such as the one described above, are activated to transmit signals and to receive response signals from a possibly unnoticed, unconnected surface coil left on the patient table.

The signals obtained at step S630B and/or C are then processed in step S640, preferably by a pre-trained machine learning module, to output at step S650 probabilities for presence of unconnected coils and/or correct location thereof relative to patient.

The probabilities may be thresholded in a redundancy check. If both probabilities are above a respective error threshold, an all-clear output signal is issued at step S670. The output all-clear-signal may initiate or control introduction of the patient in the imager's bore, or may merely be indicative to inform user about the result of the check, and it is user who then initiates patient introduction.

Otherwise, if at least one of the threshold tests is failed, this is flagged up at step S660 as an alert signal. The alert signal may be indicated to the user or patient by sound, light, display on display device, etc. The alert signal may be forwarded to user by a pager, text message, email, etc. In an autonomous imaging setting, the alert signal may be used to actively control table motion. For example, a request for table motion to introduce patient into bore is actively blocked by interference with MR imager's control circuitry/system.

The process flow then returns to optional step S620, and/or to step S630 to collect new input data after a certain time has elapsed in order for the patient or staff to make amends.

Once the response time has been allowed to elapse, process flow continues and may repeat as described above until both threshold tests are met and the patient can be eventually introduced into the bore. The process flow may loop as there may be more than one unnoticed rogue coil on the table.

As described above whilst the redundancy check step is preferred, each one of the above checks with respect to optical imagery and/or radio frequency readings from the guardian coils may be done separately, one without the other, in a simpler non-redundancy check, as required. The RF signals picked up at the guardian coil(s) can be used to establish rogue coil presence and correct placement.

Figure 7:
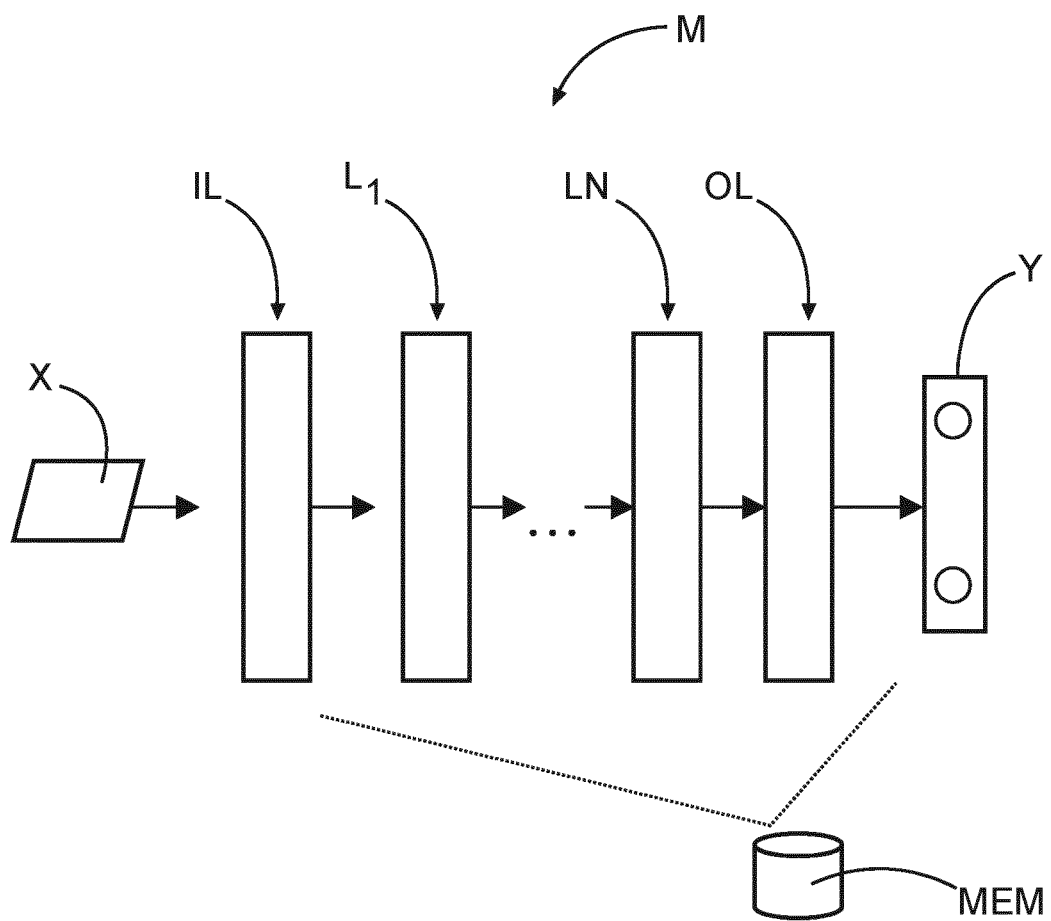
FIG. 7 shows a block diagram of a machine learning model that may be used in embodiments herein.

Reference is now made to FIG. 7 which shows a schematic diagram of a neural-network type ML-model that may be used in embodiments. As mentioned earlier, the model may include one or more fully connected layers (as opposed as to layers in a convolutional network). The neural network is configured for a classification task. Consistent with what has been described above, the classification tasks envisaged herein include classifying a spectrogram obtained by the guardian coils as to whether this represents presence of unconnected surface coils or not (referred to herein as "localization classification task"). Another classification task is whether given an image of optical camera represents presence of unconnected surface coils or not. Yet another classification task is whether surface coil is correctly placed or not, based on RF readings from guardian coils or on imagery acquired by camera (referred to below as "presence detection classification task").

For any of the above mentioned classification tasks, the model M may be trained by a computerized training systems TS to be described more fully below at FIG. 8. In training, the training system TS adapts an initial set of (model) parameters θ of the model M. In the context of neural network models, the parameters are sometime referred to herein as weights. The training data is collected in the data collection phase. Instead of the data collection phase, the training data may be generated by simulation. After the data collection phase, two further processing phases may thus be defined in relation to the machine learning model M: a training phase and a deployment (or inference) phase.

In training phase, prior to deployment phase, the model is trained by adapting its parameters based on the training data. Once trained, the model may be used in deployment phase to perform the classification tasks. The training may be a one-off operation, or may be repeated once new training data become available.

The trained machine learning model M may be stored in one (or more) computer memories MEM. The trained model M may be deployed as a machine learning component MLM on a computing device PU, preferably integrated image control IC computing system of the imager IA. Preferably, to achieve good throughput, the computing device PU includes one or more processors (CPU) that support parallel computing, such as those of multi-core design. In one embodiments, GPU(s) (graphical processing units) are used.

With continued reference to FIG. 7, this shows a neural network M in feed-forward architecture. The network M comprises a plurality of computational nodes arranged in layers L1-LN in a cascaded fashion, with data flow proceeding from left to right and thus from layer to layer. Recurrent networks are not excluded herein.

In deployment, the input data x is applied to input layer IL."x" is a spectrogram RF readings of the guardian coils, or a camera image of the patent bed./patient. The input data x then propagates through a sequence of hidden layers L1-LN (only two are shown, but there may be merely one or more than two), to then emerge at an output layer OL as an estimated output M(x). For present purposes, the output M(x) is a classification result in terms of probabilities for any of the above described classification tasks. A similar information flows applies to training data when applied to the model M during training. There may be a separate model M' (not shown) for the localization classification task and the presence detection classification task, each trained separately on respective training data. Alternatively, there is a unitary, single model for both tasks.

The model network M may be said to have a deep architecture because it has more than one hidden layers. In a feed-forward network, the "depth" is the number of hidden layers between input layer IL and output layer OL, whilst in recurrent networks the depth is the number of hidden layers, times the number of passes.

The layers of the network, and indeed the input x and output M(x), and the input and output between hidden layers (referred to herein as the above mentioned feature maps), can be represented as two or higher dimensional matrices ("tensors") for computational and memory allocation efficiency. The network output M(x) may be represented as two-dimensional vector. The vector may be normalized, thus the two entries adding up to unity to represent the probabilities as results for the above described classification task. The output layer OL may combined or all previous feature maps into a vector to represent the probabilities. For example, the output layer OL may be configured as soft-max layer to provide values within the unit interval to thus represent probabilities. The data as applied as input x to the input layer may be presented as vector such as the spectrogram or as matrix when an image is used.

The hidden layers L1-LN may include one or more convolutional layers but are preferably exclusively fully connected layers. The number of layers is at least one, such as 2-5, or any other number. The number may run into double-digit figures.

Fully connected layers FC are beneficial in regression tasks of non-image as is the case herein for the processing of spectrograms. However, one or more convolutional layers, or only such convolutional layers, may still be used as hidden layers in embodiments for processing the camera AUXS imagery. A fully connected layer is distinguished from a convolutional layer in that an entry in the output feature map of a fully connected layer is a combination of all nodes received as input from a previous by that layer. In other words, a convolutional layer is only applied, per feature map entry, to sub-sets of the input as received from an earlier layer.

It will be understood that the above described model M in FIG. 7 is merely according to one embodiment and is not limiting to the present disclosure. Other neural network architectures are also envisaged herein with more or less or different functionalities than describe herein, such as pooling layers or drop-out layers or others still. What is more, ML models M envisaged herein are not necessarily of the neural network type at all. Support Vector Machines may be used for example as an alternative. Other statistical classification models and methodology based on sampling from training data are also envisaged herein in alternative embodiments such as Bayesian networks, or random fields, such as Markov type random field and others still, such as decision trees, random forests, etc.

Figure 8:
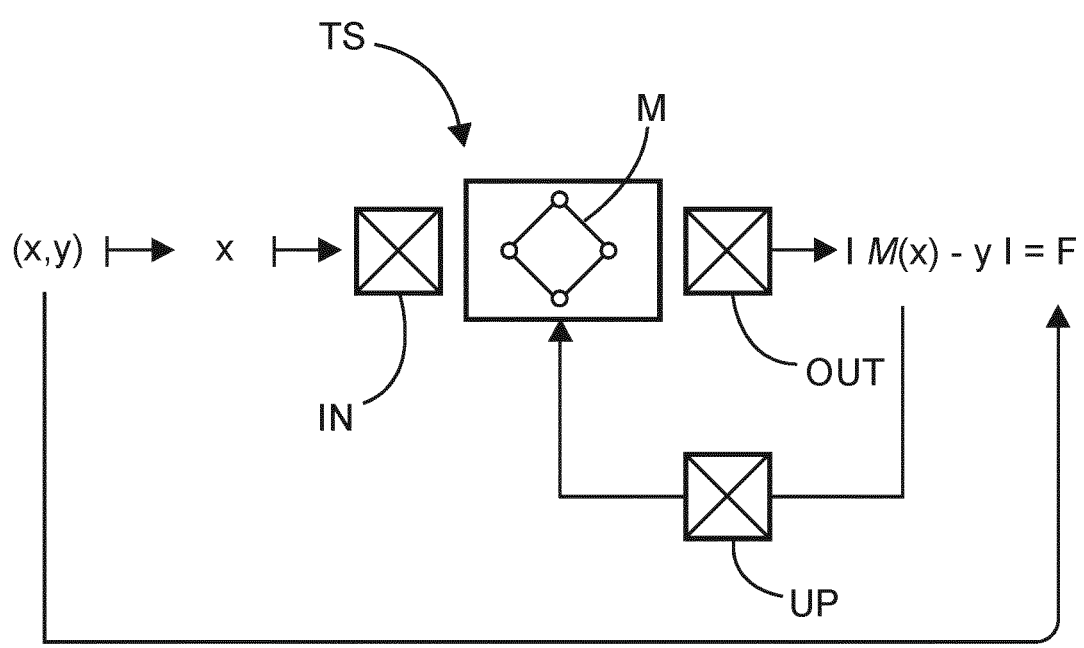
FIG. 8 shows a training system for training a machine learning model.

Reference is now made to FIG. 8 which shows a training system TS to train a machine learning mod. Training system TS is configured for learning parameters. The trainable parameters may include weights of a machine learning model M such as in a neural network as discussed in FIG. 7, or other neural network-type models, or indeed non-neural network type models, ML or statistical or others.

The training data comprises k pairs of data $(x_k, y_k)$. The training data comprises for each pair, training input data $x_k$ and an associated target $y_k$. The training data is thus organized in k pairs, in particular for supervised learning schemes as mainly envisaged herein. However, it should be noted that non-supervised learning schemes are not excluded herein.

The training input data $x_k$ may comprise, for each pair, a spectrogram (see FIG. 5 above as an example) or the camera image. The associated target $y_k$ or "ground truth" is a label conferred by an human expert human or simply follows from the experimental setup for the training data gathering. The label indicates the species of the training example, such as whether the training input data is or is not representative of a signature of an unconnected surface coil or whether or not is indicative to correct placement. The pairs $(x_k, y_k)$ are recorded in training data memory during the above described training data collection phase. Again, each member $x_k$, $y_k$ of may be presented as vectors or matrices. The training data may obtained by experimenting (eg, by placing sample surface coils and acquiring test RF readings/spectrograms or test imagery), or by simulation, as mentioned earlier.

The model is of the classifier type and attempts to classify $x_k$ into label $y_k$ as will be be explained in more detail. In the training phase, an architecture of a machine learning model M, such as the shown artificial neural network ("NN") in FIG. 7 is pre-populated with initial set of weights. The weights θ of the model M represent a parameterization $M^θ$, and it is the object of the training system TS to optimize and hence adapt the parameters θ based on the training data $(x_k, y_k)$ pairs in a training batch. In other words, the learning can be formulated mathematically as an optimization scheme where a cost function F is minimized although the dual formulation of maximizing a utility function may be used instead.

Assuming for now the paradigm of a cost function F, this measures the aggregated residue(s), that is, the error incurred between data estimated by the neural network model NN and the targets as per some or all of the training data pairs k:

$$\operatorname{argmin}_θ F = \|M^θ(x_k), y_k\|\|_k \quad (1a)$$

$$\operatorname{argmin}_θ F = \Sigma_k \|M^θ(X_k), Y_k\| \quad (1b)$$

In eq. (1a) and below, function M( ) denotes the result of the model NN applied to input x. In training, the training input data $x_k$ of a training pair is propagated through the initialized network M. Specifically, the training input $x_k$ for a k-th pair is received at an input IL, passed through the model and is then output at output OL as output training data $M^θ(x)$.

The cost Function F is based on a suitable similarity measure to measure the difference, also referred to herein as residue, between the actual training output $M^θ(x_k)$ produced by the model M, and the desired target $y_k$. The symbol $\|.,.\|$ in (1a) designates a general operator for the said cost function measure to measure the distance in a suitably chosen space, between label and prediction, given the current set of parameters θ, evaluated (symbolized by the long stroke to the very right) over some or all training pairs indexed by "i". For a binary classification as mainly envisaged herein, the cost function F measure may be formulated as a cross-entropy or Kullbach-Leibler divergence (KLD) distance/loss, or any other function suitable for a classification task. For classification tasks, such as the binary classification tasks mainly envisaged herein, the space is that of probability distribution whose distance can be measured by the cross-entropy or KLD or other measure. In this setup, the results provided by the model are considered as samples drawn from the unknown probability distributions. The prediction is thought of as a probability for the respective labels and the cross-entropy minimization (1b) is a maximum likelihood estimate. Oher maximum likelihood estimates are also envisaged herein.

In some cases eq (1a) such as for the cross-entropy function or the KLD may be written in additive form as is indicated in eq (1b), so the evaluation "·|k" over all pairs training data pairs "k" in (1a) is a summation.

The output training data $M(x_k)$ is an estimate for target $y_k$ associated with the applied input training image data $x_k$. In general, there is an error between this output $M(x_k)$ and the associated target $y_k$ of the presently considered k-th pair. An optimization scheme such as backward/forward propagation or other gradient based methods may then be used to adapt the parameters θ of the model M so as to decrease the residue for the considered pair $(x_k, y_k)$ or a subset of training pairs from the full training data set.

After one or more iterations in a first, inner, loop in which the parameters θ of the model are updated by updater UP for the current pair $(x_k, y_k)$ or pairs in a training batch, the training system TS enters a second, an outer, loop where a next training data pair $x^{k+1}$, $y^{k+1}$ or next batch of training pairs is processed accordingly. The structure of updater UP depends on the optimization scheme used. For example, the inner loop as administered by updater UP may be implemented by one or more forward and backward passes in a forward/backpropagation algorithm. While adapting the parameters, the aggregated, for example summed, residues of all the training pairs are considered up to the current pair, to improve the objective function. The aggregated residue can be formed by configuring the objective function F as a sum of squared residues such as in eq. (2) of some or all considered residues for each pair. Other algebraic combinations instead of sums of squares are also envisaged.

Optionally, one or more batch normalization operators ("BN", not shown) may be used. The batch normalization operators may be integrated into the model M, for example coupled to one or more of the convolutional operator in a layer. BN operators allow mitigating vanishing gradient effects, the gradual reduction of gradient magnitude in the repeated forward and backward passes experienced during gradient-based learning algorithms in the learning phase of the model M The batch normalization operators BN may be used in training, but may also be used in deployment.

The training system as shown in FIG. 8 can be considered for all learning schemes, in particular supervised schemes. Unsupervised learning schemes may also be envisaged herein in alternative embodiments. GPUs may be used to implement the training system TS.

The fully trained machine learning module M may be stored in one or more memories MEM or databases. The training is performed per user, to obtain different pre-trained model for each user as discussed above.

Figure 9:
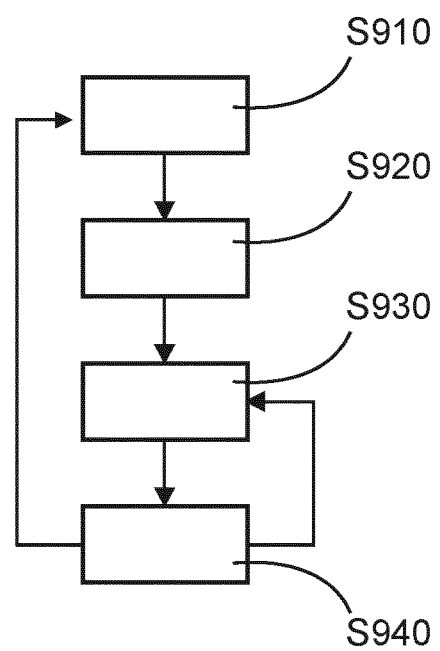
FIG. 9 shows a method for training a machine learning model.

FIG. 9 is a flow chart of a method of training a machine learning model such as the one described in any one of the above described embodiments.

Suitable training data needs to be collected as described above in the monitoring phase. Preferably, supervised learning schemes are envisaged herein although this is not a necessity as unsupervised learning setups are also envisaged herein.

In supervised learning, the training data includes suitable pairs of data items, each pair including training input data and associated therewith a target training output data. Specifically, the training data pairs ($x_k$, $y_k$) are as described above and as collected during the monitoring phase and stored in training data memory (not shown).

With continued reference to FIG. 9, at step S910 training data is received in the form of pairs ($x_k$, $y_k$). Each pair includes the training input $x_k$ and the associated target $y_k$, $x_k$, as defined in FIG. 8 above.

At step S920, the training input $x_k$ is applied to an initialized machine learning model NN to produce a training output.

A deviation, or residue, of the training output $M(x_k)$ from the associated target $y_k$ is quantified by a cost function F. One or more parameters of the model are adapted at step S930 in one or more iterations in an inner loop to improve the cost function. For instance, the model parameters are adapted to decrease residues as measured by the cost function. The parameters include in particular weights W of neural network type mode, convolutional or fully connected or partly both.

The training method then returns in an outer loop to step S910 where the next pair of training data is fed in. In step S920, the parameters of the model are adapted so that the aggregated residues of all pairs considered in the batch are decreased, in particular minimized. The cost function quantifies the aggregated residues. Forward-backward propagation or similar gradient-based techniques may be used in the inner loop.

More generally, the parameters of the model M are adjusted to improve objective function F which is either a cost function or a utility function. In embodiments, the cost function is configured to the measure the aggregated residues. In embodiments the aggregation of residues is implemented by summation over all or some residues for all pairs considered. The method may be implemented on one or more general-purpose processing units TS, preferably having processors capable for parallel processing to speed up the training.

The components of the training system TS may be implemented as one or more software modules, run on one or more processing computing systems, preferably having high performance processors, such as GPU. The training is preferably not performed by the processing unit PU of the imager IA, but may be done externally by a more powerful computing system such as one or more servers. Once trained, the model can be loaded into a data storage MEM of the one or more computing device PU that is/are to implement the guardian system SYS.

Whilst main reference to the imaging of human patients in the medical field has been made herein, the principles disclosed herein may be used to image instead animals. In addition, imaging of objects is also envisaged, such as in baggage screening or non-destructive material testing if surface coils are required.

The methods or components of the system SYS may be implemented as one or more software modules, run on one or more general-purpose processing units PU such as a workstation associated with the imager IA, or on a server computer associated with a group of imagers.

Alternatively, the methods or some or all components of the system SYS may be arranged in hardware such as a suitably programmed microcontroller or microprocessor, such an FPGA (field-programmable-gate-array) or as a hardwired IC chip, an application specific integrated circuitry (ASIC), integrated into the imager IA. In a further embodiment still, the system SYS may be implemented in both, partly in software and partly in hardware.

The step of the methods or different components of the system SYS may be implemented on a single data processing unit PU. Alternatively, some or all components or the method steps may be implemented on different processing units PU, possibly remotely arranged in a distributed architecture and connectable in a suitable communication network such as in a cloud setting or client-server setup, etc.

One or more features described herein can be configured or implemented as or with circuitry encoded within a computer-readable medium, and/or combinations thereof. Circuitry may include discrete and/or integrated circuitry, a system-on-a-chip (SOC), and combinations thereof, a machine, a computer system, a processor and memory, a computer program.

In another exemplary embodiment of the present invention, a computer program or a computer program element is provided that is characterized by being adapted to execute the method steps of the method according to one of the preceding embodiments, on an appropriate system.

The computer program element might therefore be stored on a computer unit, which might also be part of an embodiment of the present invention. This computing unit may be adapted to perform or induce a performing of the steps of the method described above. Moreover, it may be adapted to operate the components of the above-described apparatus. The computing unit can be adapted to operate automatically and/or to execute the orders of a user. A computer program may be loaded into a working memory of a data processor. The data processor may thus be equipped to carry out the method of the invention.

This exemplary embodiment of the invention covers both, a computer program that right from the beginning uses the invention and a computer program that by means of an up-date turns an existing program into a program that uses the invention.

Further on, the computer program element might be able to provide all necessary steps to fulfill the procedure of an exemplary embodiment of the method as described above.

According to a further exemplary embodiment of the present invention, a computer readable medium, such as a CD-ROM, is presented wherein the computer readable medium has a computer program element stored on it which computer program element is described by the preceding section.

A computer program may be stored and/or distributed on a suitable medium (in particular, but not necessarily, a non-transitory medium), such as an optical storage medium or a solid-state medium supplied together with or as part of other hardware, but may also be distributed in other forms, such as via the internet or other wired or wireless telecommunication systems.

However, the computer program may also be presented over a network like the World Wide Web and can be downloaded into the working memory of a data processor from such a network. According to a further exemplary embodiment of the present invention, a medium for making a computer program element available for downloading is provided, which computer program element is arranged to perform a method according to one of the previously described embodiments of the invention.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfill the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A system for supporting magnetic resonance (MR) imaging, the system comprising:

a logic configured to receive a measurement from one or more radio frequency (RF) sensors arrangeable outside a bore of an MR imaging apparatus, during use of the system and the logic to process the measurement to establish: i) whether there is at least one surface RF coil present that is not electrically coupled to circuitry of the MR imaging apparatus; and/or ii) to localize at least one surface RF coil on or at a patient table of the MR imaging apparatus; wherein the measurement is based on a response signal caused by an RF loop forming the at least one surface coil, the RF loop operable in an imaging operation of the MR imaging apparatus, and the response signal caused in response to a transmit signal transmittable by at least one transmitter.

2. The system of claim 1, wherein the logic is based on a pre-trained machine learning module.

3. The system of claim 1, wherein the logic is based on fitting the measurement to pre-stored one or more reference signals.

4. The system of claim 1, wherein the logic is further configured to receive and process imagery acquired by a camera of the patient table.

5. The system of claim 1, operable before introduction of patient via or a patient table into the bore of the MRI imaging apparatus, wherein the patient is introduced only if it is established that the at least one surface coil: i) is connected and/or ii) is localized at a location consistent with an intended image protocol.

6. The system of claim 1, wherein the measurement is an S21-measurement, obtained by operating at least two of the sensors in receive and/or transmit mode.

7. The system of claim 1, including an output port to indicate any one or more of: i) that an unconnected surface RF coil is detected, ii) a location of a or the surface RF coil (SC) on or at the patient table, or iii) whether the location is consistent with an intended imaging protocol.

8. The system of claim 1, wherein the one or more sensors are integrated in a surface of the or a patient table.

9. An imaging arrangement including a system of claim 1, and an MR imaging apparatus.

10. A method for supporting magnetic resonance (MR) imaging, the method comprising:

receiving a measurement from one or more RF sensors arrangeable outside a bore of an MR imaging apparatus, and processing the measurement to establish: i) whether there is at least one surface RF coil present that is not electrically coupled to circuitry of the MR imaging apparatus; and/or ii) to localize at least one surface RF coil on or at a patient table of the MR imaging apparatus; wherein the measurement is based on a response signal caused by an RF loop forming the at least one surface coil, the RF loop operable in an imaging operation of the MR imaging apparatus, and the response caused in response to a transmit signal transmittable by at least one transmitter.

11. A computer program element stored in a non-transitory computer readable medium, which when being executed by at least one processing unit, is configured to cause a processing unit to perform the method of claim 10.

* * * * *